US012635329B2

(12) United States Patent
Gao et al.

(10) Patent No.: US 12,635,329 B2
(45) Date of Patent: May 19, 2026

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yingchang Gao, Beijing (CN); Kening Zheng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 600 days.

(21) Appl. No.: 18/022,154

(22) PCT Filed: May 30, 2022

(86) PCT No.: PCT/CN2022/095888
§ 371 (c)(1),
(2) Date: Feb. 19, 2023

(87) PCT Pub. No.: WO2023/230750
PCT Pub. Date: Dec. 7, 2023

(65) Prior Publication Data

US 2024/0284690 A1 Aug. 22, 2024

(51) Int. Cl.
*H10K 39/34* (2026.01)
*H10K 50/19* (2023.01)

(52) U.S. Cl.
CPC ............. *H10K 39/34* (2023.02); *H10K 50/19* (2023.02)

(58) Field of Classification Search
CPC ............................... H10K 39/34; H10K 50/19
See application file for complete search history.

(56) References Cited

U.S. PATENT DOCUMENTS

| | | | | |
|---|---|---|---|---|
| 2012/0097989 | A1* | 4/2012 | Lee | H10K 50/19 257/E33.012 |
| 2023/0134363 | A1* | 5/2023 | Park | G06V 40/1318 382/124 |

FOREIGN PATENT DOCUMENTS

| | | | |
|---|---|---|---|
| CN | 106783932 | A | 5/2017 |
| CN | 107579101 | A | 1/2018 |
| CN | 109065587 | A | 12/2018 |

(Continued)

*Primary Examiner* — Daniel P Shook
(74) *Attorney, Agent, or Firm* — HOUTTEMAN LAW LLC

(57) ABSTRACT

A display substrates and display device are provided, belong to the field of display technology, and can solve the problem that the performance of the light-emitting layer of the optical sensor in the existing display substrate is unstable, and the light absorbing layer becomes insensitive to the light after a long time of use. The display substrate includes: a substrate, light-emitting devices on the substrate, and an optical sensor between at least a portion of adjacent ones of the plurality of light-emitting devices. The optical sensor includes: a P-type organic material layer and an N-type organic material layer stacked with each other, and a difference between an energy level of a highest occupied molecular orbital of the P-type organic material layer and an energy level of a lowest unoccupied molecular orbital of the N-type organic material layer is less than 2.0 eV or greater than 2.7 eV.

12 Claims, 4 Drawing Sheets

(56) References Cited

FOREIGN PATENT DOCUMENTS

| | | | |
|---|---|---|---|
| CN | 110061041 | A | 7/2019 |
| CN | 113823744 | A | 12/2021 |

* cited by examiner

DISPLAY SUBSTRATE AND DISPLAY DEVICE

CROSS-REFERENCE TO RELATED APPLICATION

This is a National Phase Application filed under 35 U.S.C. 371 as a national stage of PCT/CN2022/095888, filed on May 30, 2022, the contents of which are incorporated herein in their entirety by reference.

TECHNICAL FIELD

The present disclosure relates to the field of display technology, and particularly relates to a display substrate and a display device.

BACKGROUND

Fingerprint identification is a typical representative of biometric identification, and is adopted to identify a personal identity by uniqueness, lifetime invariance and convenience of a fingerprint of a finger of the person. Fingerprint identification has been adopted by more and more industries and products, such as mobile phones, notebook computers, smart televisions, etc., due to its advantages of being fast, unique, convenient, etc. The fingerprint identification may be implemented by: forming an image of the fingerprint of the finger by using difference of reflection capability of valleys and ridges on a surface of the finger to light and difference of currents formed by photoelectric conversion, and then analyzing the image to identify and determine the fingerprint of the finger.

In the field of display, the fingerprint identification may be implemented by receiving light reflected by a finger and converting the light into current, through an optical sensor. An organic photodiode may be disposed in the same layer as a light-emitting device in a display device, which is convenient for integration, and has been widely used. However, a light absorbing layer of the current organic photodiode is unstable in material performance. After long-term use, the light absorbing layer in the organic photodiode becomes insensitive to light, resulting in that the current formed under weak light is weak, and the requirement of fingerprint identification cannot be met. Meanwhile, in fabrication of the organic photodiode, the light absorbing layer needs to be formed by using a mask plate, resulting in that the fabrication process is complex, and the process cost is increased.

SUMMARY

The present disclosure is directed to at least one of the technical problems in the prior art, and provides a display substrate and a display device.

In a first aspect, the present disclosure provides a display substrate, including: a substrate, a plurality of light-emitting devices on the substrate, and an optical sensor between at least a portion of adjacent ones of the plurality of light-emitting devices, wherein the optical sensor includes: a P-type organic material layer and a N-type organic material layer stacked with each other, and a difference between an energy level of a highest occupied molecular orbital of the P-type organic material layer and an energy level of a lowest unoccupied molecular orbital of the N-type organic material layer is less than 2.0 eV or greater than 2.7 eV.

Optionally, each light-emitting device includes: a light-emitting layer, a hole transport layer on a side of the light-emitting layer close to the substrate, and an electron transport layer on a side of the light-emitting layer away from the substrate.

Optionally, the P-type organic material layer is in a same layer as the hole transport layer; and the N-type organic material layer is in a same layer as the electron transport layer.

Optionally, the light-emitting layer includes: a first light-emitting layer and a second light-emitting layer stacked with each other; and each light-emitting device further includes: an electron generation layer between the first light-emitting layer and the second light-emitting layer and close to the first light-emitting layer, and a hole generation layer between the first light-emitting layer and the second light-emitting layer and close to the second light-emitting layer.

Optionally, the P-type organic material layer is in a same layer as the hole generation layer; and the N-type organic material layer is in a same layer as the electron generation layer.

Optionally, the P-type organic material layer is in a same layer as the hole transport layer; and the N-type organic material layer is in a same layer as the electron generation layer.

Optionally, the P-type organic material layer is in a same layer as the hole generation layer; and the N-type organic material layer is in a same layer as the electron transport layer.

Optionally, each light-emitting device further includes: a first auxiliary light-emitting layer between the first light-emitting layer and the hole transport layer, and a second auxiliary light-emitting layer between the second light-emitting layer and the hole generation layer.

Optionally, the P-type organic material layer is in a same layer as the first auxiliary light-emitting layer; and the N-type organic material layer is in a same layer as the electron generation layer.

Optionally, the P-type organic material layer is in a same layer as the second auxiliary light-emitting layer; and the N-type organic material layer is in a same layer as the electron transport layer.

Optionally, the P-type organic material layer includes: a first P-type organic material layer and a second P-type material layer; the N-type organic material layer includes: a first N-type organic material layer and a second N-type organic material layer; the first P-type organic material layer is in a same layer as the first auxiliary light-emitting layer; the first N-type organic material layer is in a same layer as the electron generation layer; the second P-type organic material layer is in a same layer as the second auxiliary light-emitting layer; and the second N-type organic material layer is in a same layer as the electron transport layer.

Optionally, the display substrate further includes: a pixel defining layer on the substrate; and the light-emitting devices and the optical sensor are in different regions defined by the pixel defining layer; and the pixel defining layer is made of a light shielding material.

Optionally, the P-type organic material layer is made of a material that includes: at least one of TAPC, NPB and TPD.

Optionally, the N-type organic material layer is made of a material that includes: at least one of m-MTDATA and TmPyTZ.

In a second aspect, the present disclosure provides a display device, including the display substrate described above.

DETAIL DESCRIPTION OF EMBODIMENTS

In order to enable one of ordinary skill in the art to better understand the technical solutions of the present disclosure, the present disclosure will be described in further detail with reference to the accompanying drawings and the specific embodiments.

Unless defined otherwise, technical or scientific terms used herein shall have the ordinary meanings as understood by one of ordinary skill in the art to which the present disclosure belongs. The term "first," "second," or the like used in the present disclosure is not intended to indicate any order, quantity, or importance, but rather is used to distinguish one element from another. Also, the term "a," "an," "the" or similar referent does not denote a limitation of quantity, but rather denote the presence of at least one. The word "include", "comprise", or the like, means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The term "upper", "lower", "left", "right", or the like is used only to indicate relative positional relationship, and when the absolute position of the object being described is changed, the relative positional relationship may also be changed accordingly.

Figure 1:
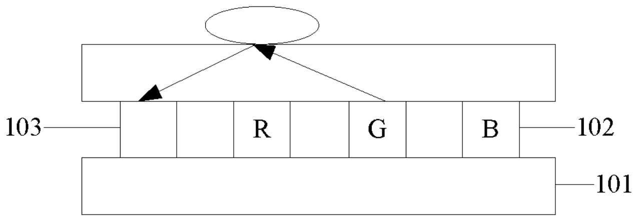
FIG. 1 is a schematic structural diagram of an exemplary display substrate.

FIG. 1 is a schematic structural diagram of an exemplary display substrate. As shown in FIG. 1, the display substrate includes: a substrate 101, a plurality of light-emitting devices 102 on the substrate 101, and an optical sensor 103 between at least a portion of adjacent ones of the light-emitting devices 102.

Each light-emitting device 102 may be an organic light-emitting diode (OLED) or other self-luminous devices. Specifically, the light-emitting device 102 may include a red light-emitting device R, a green light-emitting device G, or a blue light-emitting device B, and the red light-emitting device R, the green light-emitting device G, and the blue light-emitting device B may serve as three sub-pixels to form a pixel unit, and one pixel unit may emit light of different colors, so as to implement color display.

The optical sensor 103 may be an organic photodiode, which may be disposed in a same layer as each light-emitting device 102 to improve integration of the optical sensor 103 in the display substrate. The organic photodiode may be a PN junction in which a light absorbing layer is between two organic layers of different types.

The light emitted by the light-emitting device 102 is emitted from a light outgoing surface of the display substrate and then irradiates on a surface of the finger, the surface of the finger reflects the light to the optical sensor 103, and the light absorbing layer in the optical sensor 103 absorbs the reflected light and converts the reflected light into an electrical signal. Because valleys and ridges on the surface of the finger have different light reflection abilities and the currents formed through photoelectric conversion are different, an image of the fingerprint of the finger may be formed, and then the image is analyzed so as to identify and determine the fingerprint of the finger.

However, the light absorbing layer of the current organic photodiode is unstable in material performance. After long-term use, the light absorbing layer becomes insensitive to light, resulting in that the current formed under weak light is weak, and the requirement of fingerprint identification cannot be met. Meanwhile, in the fabrication of the organic photodiode, the light absorbing layer needs to be formed by using a mask plate, resulting in that the fabrication process is complex, and the process cost is increased.

In order to solve at least one of the above technical problems, embodiments of the present disclosure provide a display substrate and a display device, which will be described in further detail with reference to the accompanying drawings and detailed description.

Figure 2:
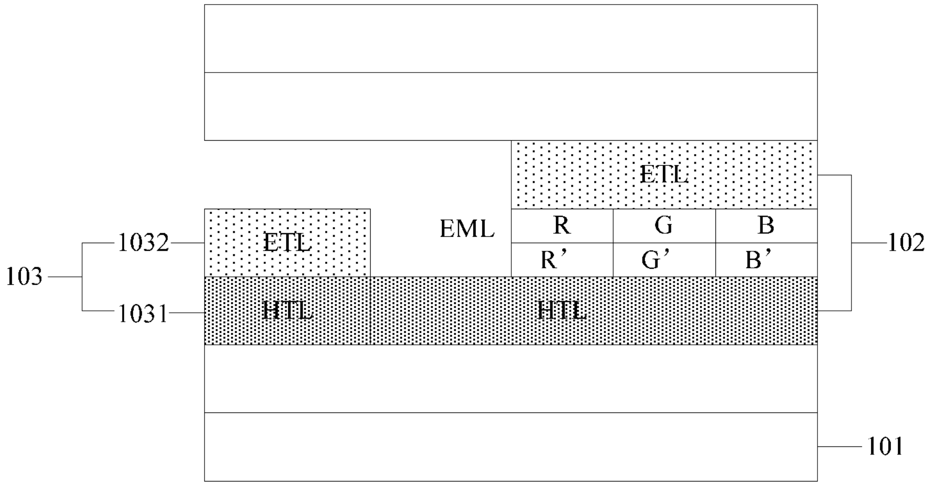
FIG. 2 is a schematic structural diagram of a first display substrate according to an embodiment of the present disclosure.

In a first aspect, an embodiment of the present disclosure provides a display substrate, and FIG. 2 is a schematic structural diagram of the first display substrate according to an embodiment of the present disclosure. As shown in FIG. 2, the display substrate includes: a substrate 101, a plurality of light-emitting devices 102 on the substrate 101, and an optical sensor 103 between at least a portion of adjacent ones of the light-emitting devices 102. The optical sensor 103 includes: a P-type organic material layer 1031 and an N-type organic material layer 1032 which are stacked with each other, and a difference between an energy level of a highest occupied molecular orbital of the P-type organic material layer 1031 and an energy level of a lowest unoccupied molecular orbital of the N-type organic material layer 1032 is less than 2.0 eV or more than 2.7 eV.

The substrate 101 may be made of a rigid material such as glass, which can improve carrying capacity of the substrate 101 for other film layers thereon. Certainly, the substrate 101 may also be made of a flexible material such as polyimide (PI), which can improve the performance of bending resistance and stretching resistance of the whole light-emitting devices, and prevent the substrate 101 from being broken due to the stress generated during the bending, stretching, and twisting processes to result in poor performance such as an open circuit. In practical applications, the material of the substrate 101 may be selected reasonably according to actual needs to ensure that the display substrate has a good performance. A driving circuit layer is generally disposed between the substrate 101 and the light-emitting devices 102, and a pixel driving circuit formed by a plurality of thin film transistors is disposed in the driving circuit layer, and may provide driving signals to the light-emitting devices 102 and the optical sensors 103. The specific structure of the pixel driving circuit in the driving circuit layer is the same as that of the pixel driving circuit in the related art, and will not be described here.

Each light-emitting device 102 may be specifically an organic light-emitting diode (OLED) or other self-luminous devices. Generally, each light-emitting device 102 includes a first electrode and a second electrode disposed oppositely, a light-emitting layer disposed between the first electrode and the second electrode, and other organic functional layers for transporting carriers, and the specific structure thereof will be described in further detail in the following embodiments. A polarity of the first electrode is opposite to that of the second electrode. The first electrode may be specifically an anode, the second electrode may be specifically a cathode, the anode may be coupled to a high-level power supply signal terminal through thin film transistors in the pixel driving circuit, and the cathode may be coupled to a low-level power supply signal terminal. The light-emitting layer may emit light under the drive of an electric field between the anode and the cathode, a color of the light is based on the material of the light-emitting layer, and suitable materials may be selected so that a corresponding light-emitting device 102 emits red, green, or blue light.

Specifically, the optical sensor 103 may be an organic photodiode, which includes a P-type organic material layer 1031 and an N-type organic material layer 1032 stacked with each other, and both the P-type organic material layer 1031 and the N-type organic material layer 1032 may constitute an organic heterojunction. The energy level of the highest occupied molecular orbital (HOMO) of the P-type organic material layer 1031 may be between 4.8 eV and 5.8 eV, which facilitates injection of holes from the anode into the P-type organic material layer 1031. In addition, a hole mobility of the P-type organic material layer 1031 is greater than $10^{-4}$ $cm^2/(V \cdot s)$, which facilitates transport of holes from an interface of the anode to an interface of the organic heterojunction. Accordingly, the energy level of the lowest unoccupied molecular orbital (LUMO) of the N-type organic material layer 1032 is matched with the energy level of the highest occupied molecular orbital (HOMO) of the P-type organic material layer 1031, which facilitates injection of electrons from the cathode into the N-type organic material layer 1032. In addition, the N-type organic material has a high electron mobility, which facilitates transport of electrons from an interface of the cathode to the interface of the organic heterojunction. Preferably, the difference between the energy level of the highest occupied molecular orbital (HOMO) of the P-type organic material layer 1031 and the energy level of the lowest unoccupied molecular orbital (LUMO) of the N-type organic material layer is less than 2.0 eV or more than 2.7 eV, so as to ensure that the optical sensor 103 has a good photoelectric conversion performance without generating visible light under forward bias.

It can be seen that in the display substrate according to the embodiment of the present disclosure, the optical sensor 103 includes the P-type organic material layer 1031 and the N-type organic material layer 1032 only with no light absorbing layer therebetween, so that the problem that a current formed under weak light is weak and a requirement of fingerprint identification cannot be met due to unstable material performance and the insensitive light absorption of the light absorbing layer after long-term use can be avoided. Meanwhile, since no light absorbing layer is disposed, a mask plate is not required to form the light absorbing layer in the fabrication of the optical sensor 103, so that the process steps can be reduced, and the fabrication cost can be saved.

In some embodiments, as shown in FIG. 2, each light-emitting device 102 includes: a light-emitting layer EML, a hole transport layer HTL on a side of the light-emitting layer EML close to the substrate 101, and an electron transport layer ETL on a side of the light-emitting layer EML away from the substrate 101.

The light-emitting layer EML of the light-emitting device 102 may include a red light-emitting layer R, a green light-emitting layer G, and a blue light-emitting layer B disposed in the same layer. The light-emitting layer EML is a single-layer structure, holes generated by the anode may be transported to the light-emitting layer EML through the hole transport layer HTL, electrons generated by the cathode may be transported to the light-emitting layer EML through the electron transport layer ETL, and the holes and the electrons form hole-electron pairs in the light-emitting layer EML to release energy outwards to emit light, so as to emit red light, green light, or blue light.

In some embodiments, as shown in FIG. 2, the P-type organic material layer 1031 is disposed in the same layer as the hole transport layer HTL, and the N-type organic material layer 1032 is disposed in the same layer as the electron transport layer ETL.

The hole transport layer HTL may be made of a P-type organic material and has a good hole transport performance, and the electron transport layer ETL may be made of an N-type organic material and has a good electron transport performance. Suitable materials may be selected such that a difference between an energy level of the highest occupied molecular orbital of the hole transport layer HTL and an energy level of the lowest unoccupied molecular orbital of the electron transport layer ETL is less than 2.0 eV or greater than 2.7 eV. Meanwhile, the P-type organic material layer 1031 and the hole transport layer HTL are disposed in the same layer and are made of the same material and are formed through the same process, and the N-type organic material layer 1032 and the electron transport layer ETL are disposed in the same layer and are made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 3:
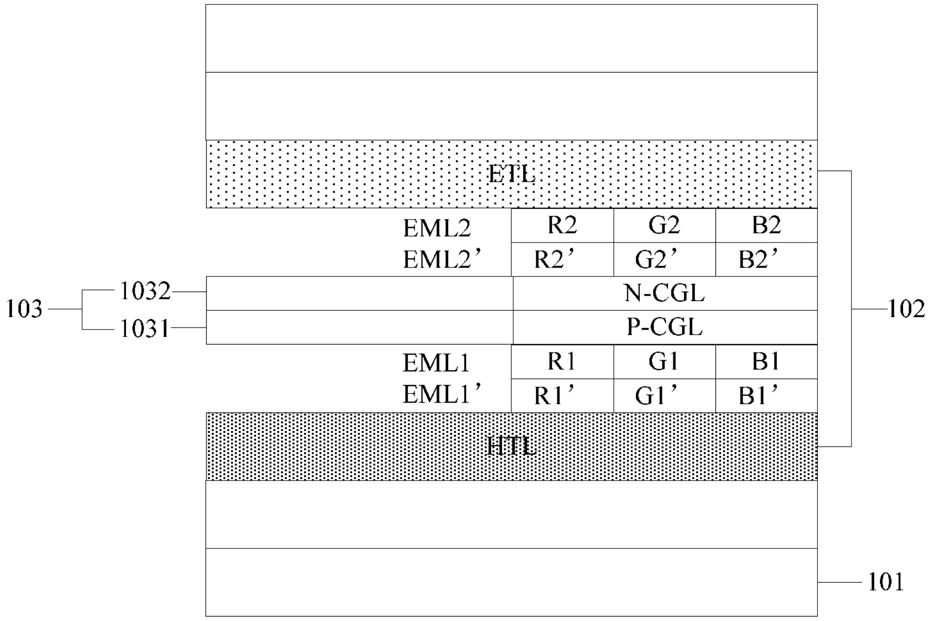
FIG. 3 is a schematic structural diagram of a second display substrate according to an embodiment of the present disclosure.

FIG. 3 is a schematic structural diagram of a second display substrate according to an embodiment of the present disclosure. As shown in FIG. 3, in the display substrate, the light-emitting layer EML includes: a first light-emitting layer EML1 and a second light-emitting layer EML2 which are stacked with each other; each light-emitting device 102 further includes: an electron generation layer N-CGL between the first and second light-emitting layers EML1 and EML2 and close to the second light-emitting layer EML2, and a hole generation layer P-CGL between the first and second light-emitting layers EML1 and EML2 and close to the first light-emitting layer EML1.

The light-emitting device 102 may include two light-emitting layers EML, that is, the first light-emitting layer EML1 and the second light-emitting layer EML2. The first light-emitting layer EML1 may include a first red light-emitting layer R1, a first green light-emitting layer G1 and a first blue light-emitting layer B1 which are disposed in the same layer, and the second light-emitting layer EML2 may include a second red light-emitting layer R2, a second green light-emitting layer G2 and a second blue light-emitting layer B2 which are disposed in the same layer. Holes generated by the anode may be transported to the first light-emitting layer EML1 through the hole transport layer HTL, electrons generated by the electron generation layer N-CGL may be transported to the first light-emitting layer EML1, and the electrons and the holes form a hole-electron pairs in the first light-emitting layer EML1, so as to release energy and emit light, thereby emitting red, green, or blue light. Similarly, holes generated by the hole generation layer P-CGL may be transported to the second light-emitting layer EML2, electrons generated by the cathode may be transported to the second light-emitting layer EML2 through the electron transport layer ETL, and the electrons and holes form hole-electron pairs in the second light-emitting layer EML2, so as to release energy and emit light, thereby emitting red, green, or blue light. The light-emitting layer EML having the double-layer structure can improve the light-emitting efficiency of the light-emitting devices 102, and is favorable for improving the display effect of the display substrate.

In some embodiments, as shown in FIG. 3, the P-type organic material layer 1031 is disposed in the same layer as the hole generation layer P-CGL; and the N-type organic material layer 1032 is disposed in the same layer as the electron generation layer N-CGL.

The hole generation layer P-CGL may be made of a P-type organic material and has a good hole transport performance, and the electron generation layer N-CGL may be made of an N-type organic material and has a good electron transport performance. Suitable materials may be selected such that the difference between the energy level of the highest occupied molecular orbital of the hole generation layer P-CGL and the energy level of the lowest unoccupied molecular orbital of the electron generation layer N-CGL is less than 2.0 eV or greater than 2.7 eV. Meanwhile, the P-type organic material layer 1031 and the hole generation layer P-CGL are disposed in the same layer and made of the same material and are formed through the same process, and the N-type organic material layer 1032 and the electron generation layer N-CGL are disposed in the same layer and made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 4:
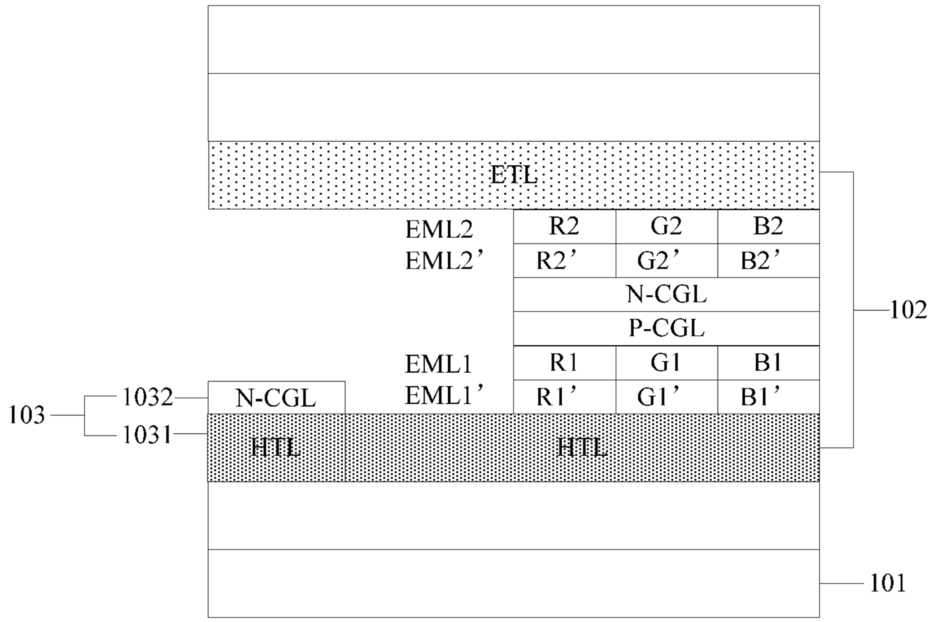
FIG. 4 is a schematic structural diagram of a third display substrate according to an embodiment of the present disclosure.

FIG. 4 is a schematic structural diagram of a third display substrate according to an embodiment of the present disclosure. As shown in FIG. 4, a light-emitting device in FIG. 4 has the same structure as the light-emitting device in FIG. 3, except that in FIG. 4, the P-type organic material layer 1031 and the hole transport layer HTL are disposed in the same layer; the N-type organic material layer 1032 and the electron generation layer N-CGL are disposed in the same layer.

The hole transport layer HTL may be made of a P-type organic material and has a good hole transport performance, and the electron generation layer N-CGL may be made of an N-type organic material and has a good electron transport performance. Suitable materials may be selected such that the difference between the energy level of the highest occupied molecular orbital of the hole transport layer HTL and an energy level of a lowest unoccupied molecular orbital of the electron generation layer N-CGL is less than 2.0 eV or greater than 2.7 eV. Meanwhile, the P-type organic material layer 1031 and the hole transport layer HTL are disposed in the same layer and are made of the same material and are formed through the same process, and the N-type organic material layer 1032 and the electron generation layer N-CGL are disposed in the same layer and are made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 5:
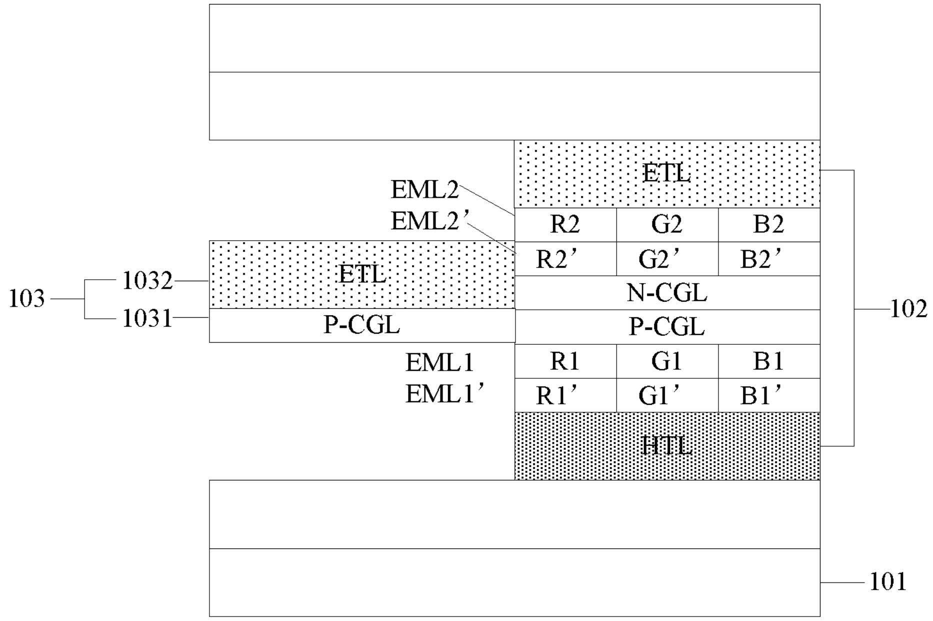
FIG. 5 is a schematic structural diagram of a fourth display substrate according to an embodiment of the present disclosure.

FIG. 5 is a schematic structural diagram of a fourth display substrate according to an embodiment of the present disclosure. As shown in FIG. 5, a structure of a light-emitting device in FIG. 5 is the same as that of the light-emitting device in FIG. 3, except that in FIG. 5, the P-type organic material layer 1031 and the hole generation layer P-CGL are disposed in the same layer; and the N-type organic material layer 1032 and the electron transport layer ETL are disposed in the same layer.

The hole generation layer P-CGL may be made of a P-type organic material and has a good hole transport performance, and the electron transport layer ETL may be made of an N-type organic material and has a good electron transport performance. Suitable materials may be selected such that the difference between an energy level of a highest occupied molecular orbital of the hole generation layer P-CGL and the energy level of the lowest unoccupied molecular orbital of the electron transport layer ETL is less than 2.0 eV or greater than 2.7 eV. Meanwhile, the P-type organic material layer 1031 and the hole generation layer P-CGL are disposed in the same layer and made of the same material and are formed through the same process, and the N-type organic material layer 1032 and the electron transport layer ETL are disposed in the same layer and made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 6:
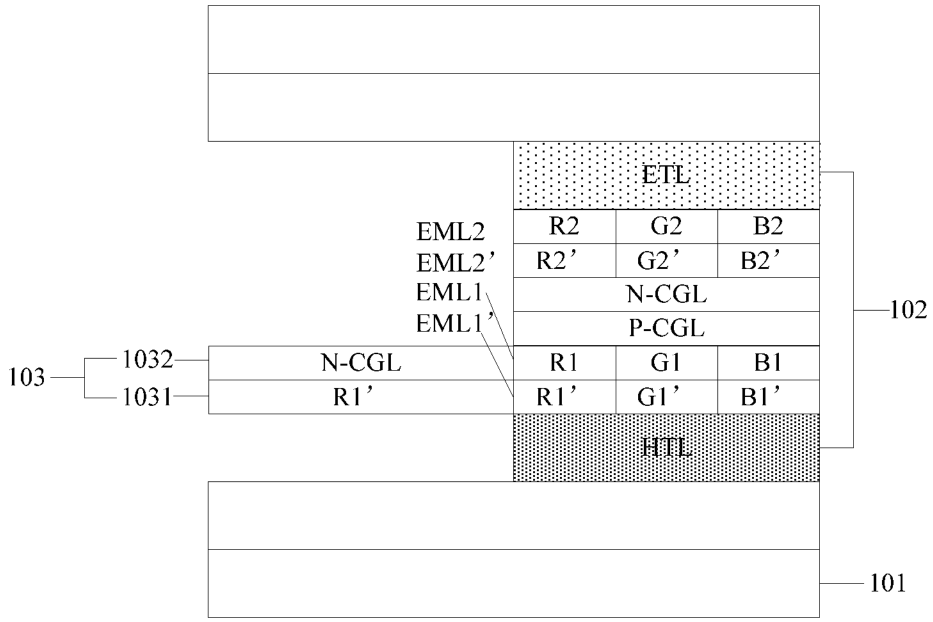
FIG. 6 is a schematic structural diagram of a fifth display substrate according to an embodiment of the present disclosure.

FIG. 6 is a schematic structural diagram of a fifth display substrate according to an embodiment of the present disclosure. As shown in FIG. 6, each light-emitting device 102 further includes: a first auxiliary light-emitting layer EML1' between the first light-emitting layer EML1 and the hole transport layer HTL, and a second auxiliary light-emitting layer EML2' between the second light-emitting layer EML2 and the hole generation layer P-CGL.

The first auxiliary light-emitting layer EML1' may specifically include a first red auxiliary light-emitting layer R1', a first green auxiliary light-emitting layer G1', and a first blue auxiliary light-emitting layer B1' that are disposed in the same layer and respectively correspond to the first red light-emitting layer R1, the first green light-emitting layer G1, and the first blue light-emitting layer B1. The second auxiliary light-emitting layer EML2' may specifically include a second red auxiliary light-emitting layer R2', a second green auxiliary light-emitting layer G2', and a second blue auxiliary light-emitting layer B2' which are disposed in the same layer and respectively correspond to the second red light-emitting layer R2, the second green light-emitting layer G2, and the second blue light-emitting layer B2. The first auxiliary light-emitting layer EML1' and the second auxiliary light-emitting layer EML2' are beneficial to the transport of holes, so that the transport efficiency of electrons and the transport efficiency of holes are matched with each other, and the light-emitting efficiency of the light-emitting device is improved.

In some embodiments, as shown in FIG. 6, the P-type organic material layer 1031 is disposed in the same layer as the first auxiliary light-emitting layer EML1'; and the N-type organic material layer 1032 is disposed in the same layer as the electron generation layer N-CGL.

The first auxiliary light-emitting layer EML1' may be made of a P-type organic material and has a good hole transport performance, and the electron generation layer N-CGL may be made of an N-type organic material and has a good electron transport performance. Suitable materials may be selected such that a difference between an energy level of a highest occupied molecular orbital of the first auxiliary light-emitting layer EML1' and the energy level of the lowest unoccupied molecular orbital of the electron generation layer N-CGL is less than 2.0 eV or greater than 2.7 eV. Meanwhile, the P-type organic material layer 1031 and the first auxiliary light-emitting layer EML1' are disposed in the same layer, and are made of the same material and are formed through the same process, and the N-type organic material layer 1032 and the electron generation layer N-CGL are disposed in the same layer, and are made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 7:
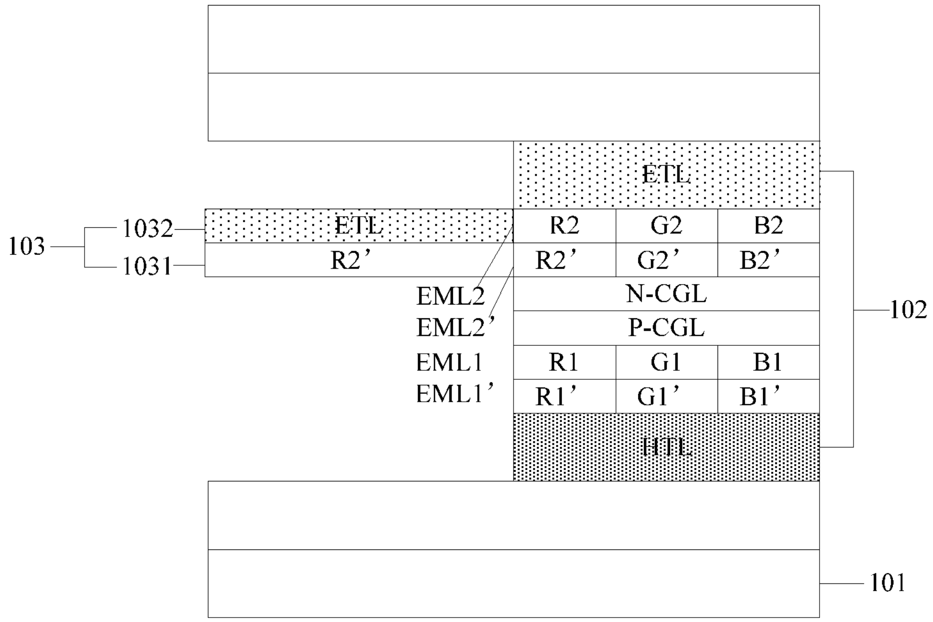
FIG. 7 is a schematic structural diagram of a sixth display substrate according to an embodiment of the present disclosure.

FIG. 7 is a schematic structural diagram of a sixth display substrate according to an embodiment of the present disclosure. As shown in FIG. 7, a structure of a light-emitting device in FIG. 7 is the same as that of the light-emitting device in FIG. 6, except that in FIG. 7, the P-type organic material layer 1031 and the second auxiliary light-emitting layer EML2' are disposed in the same layer; and the N-type organic material layer 1032 is disposed in the same layer as the electron transport layer ETL.

The second auxiliary light-emitting layer EML2' may be made of a P-type organic material and has a good hole transport performance, and the electron transport layer ETL may be made of an N-type organic material and has a good electron transport performance. Suitable materials may be selected such that a difference between an energy level of a highest occupied molecular orbital of the second auxiliary light-emitting layer EML2' and the energy level of the lowest unoccupied molecular orbital of the electron transport layer ETL is less than 2.0 eV or greater than 2.7 eV. Meanwhile, the P-type organic material layer 1031 and the second auxiliary light-emitting layer EML2' are disposed in the same layer and made of the same material and are formed through the same process, and the N-type organic material layer 1032 and the electron transport layer ETL are disposed in the same layer and made of the same material and are formed through the same process, so that the process steps can be reduced, and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, and thus is beneficial to making the display substrate light and thin.

Figure 8:
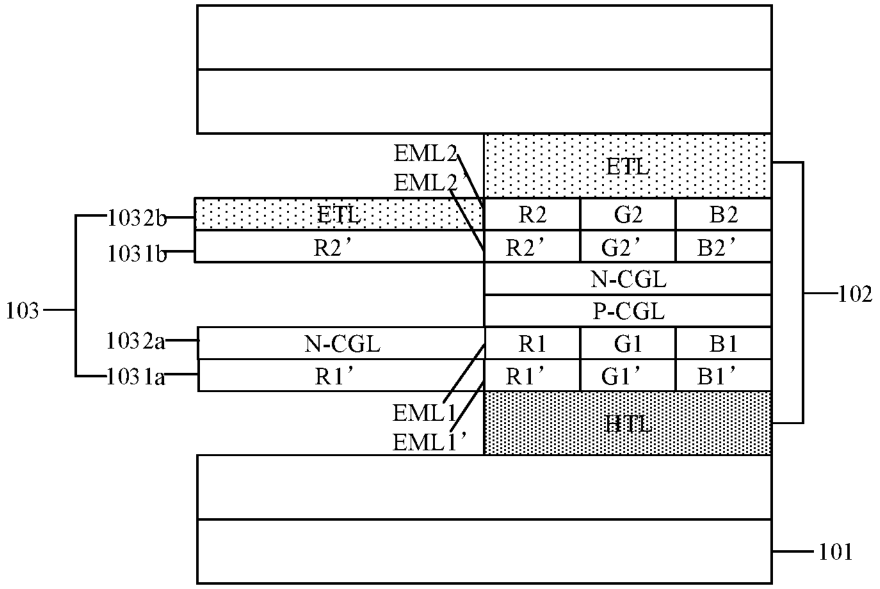
FIG. 8 is a schematic structural diagram of a seventh display substrate according to an embodiment of the present disclosure.

FIG. 8 is a schematic structural diagram of a seventh display substrate according to an embodiment of the present disclosure. As shown in FIG. 8, a structure of a light-emitting device in FIG. 8 is the same as that of the light-emitting device in FIG. 6, except that in FIG. 8, the P-type organic material layer 1031 includes: a first P-type organic material layer 1031*a* and a second P-type material layer 1031*b*; the N-type organic material layer 1032 includes: a first N-type organic material layer 1032*a* and a second N-type organic material layer 1032*b*; the first P-type organic material layer 1031*a* is disposed in the same layer as the first auxiliary light-emitting layer EML1'; the first N-type organic material layer 1032*a* is disposed in the same layer as the electron generation layer N-CGL; the second P-type organic material layer 1031*b* is disposed in the same layer as the second auxiliary light-emitting layer EML2'; and the second N-type organic material layer 1032*b* is disposed in the same layer as the electron transport layer ETL.

The first auxiliary light-emitting layer EML1' and the second auxiliary light-emitting layer EML2' may be made of P-type organic materials and have a good hole transport performance, and the electron generation layer N-CGL and the electron transport layer ETL may be made of N-type organic materials and have a good electron transport performance. Suitable materials may be selected such that the difference between the energy level of the highest occupied molecular orbital of the first auxiliary light-emitting layer EML1' and the energy level of the lowest unoccupied molecular orbital of the electron generation layer N-CGL is less than 2.0 eV or greater than 2.7 eV. The difference between the energy level of the highest occupied molecular orbital of the second auxiliary light-emitting layer EML2' and the energy level of the lowest unoccupied molecular orbital of the electron transport layer ETL is less than 2.0 eV or more than 2.7 eV. Meanwhile, the first P-type organic material layer 1031*a* and the first auxiliary light-emitting layer EML1' are disposed in the same layer, and are made of the same material and are formed through the same process, the first N-type organic material layer 1032*a* and the electron generation layer N-CGL are disposed in the same layer, and are made of the same material and are formed through the same process, the second P-type organic material layer 1031*b* and the second auxiliary light-emitting layer EML2' are disposed in the same layer, and are made of the same material and are formed through the same process, and the second N-type organic material layer 1032*b* and the electron transport layer ETL are disposed in the same layer, and are made of the same material and are formed through the same process. Thus, the process steps can be reduced and the fabrication cost can be saved. Meanwhile, each film layer in the optical sensor 103 does not need to be disposed in a separate film layer, which is beneficial to improving the integration level of the optical sensor 103 in the display substrate, and can reduce the thickness of the display substrate, thus is beneficial to making the display substrate light and thin.

Figure 9:
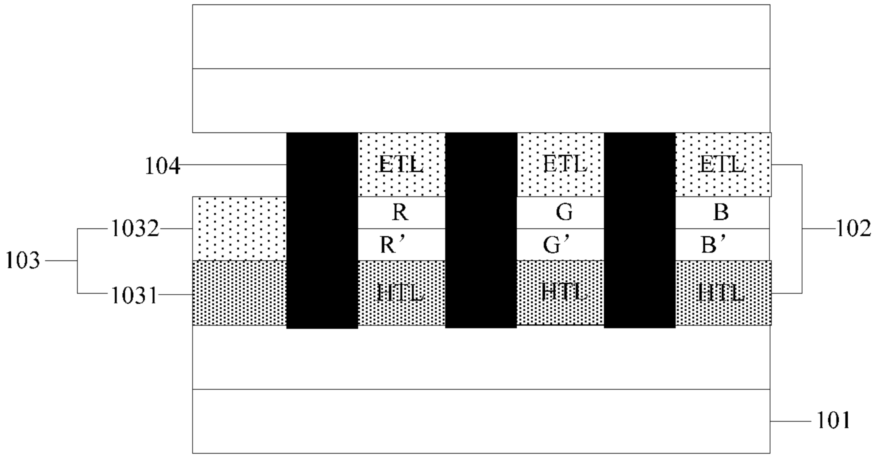
FIG. 9 is a schematic structural diagram of an eighth display substrate according to an embodiment of the present disclosure.

FIG. 9 is a schematic structural diagram of an eighth display substrate according to an embodiment of the present disclosure. As shown in FIG. 9, the display substrate further includes: a pixel defining layer 104 on the substrate 101; the light-emitting devices 102 and the optical sensor 103 are located in different regions defined by the pixel defining layer 104; and the pixel defining layer 104 may be made of a light-shielding material.

The pixel defining layer 104 may be made of the light-shielding material, and may separate the light-emitting device 102 from the optical sensor 103 adjacent thereto, so as to prevent light emitted by the light-emitting device 102 from entering into the optical sensor 103 along a horizontal direction to form stray light and influence the performance of the optical sensor 103, thereby improving the accuracy of fingerprint identification.

In some embodiments, the P-type organic material layer 1031 may be made of a material that includes: at least one of TAPC, NPB and TPD.

The material for the P-type organic material layer 1031 is at least one of TAPC, NPB, and TPD, and the specific molecular formulas of the three materials are as follows:

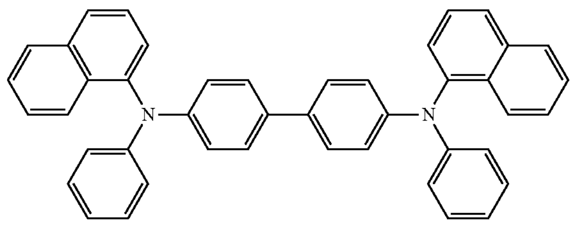

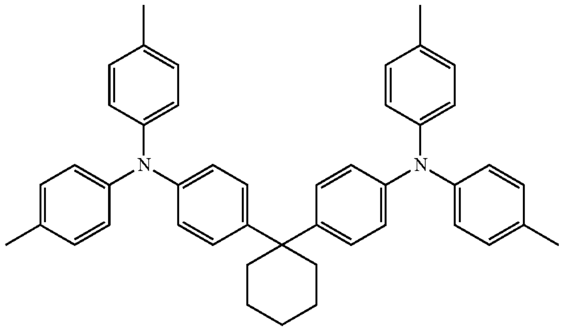

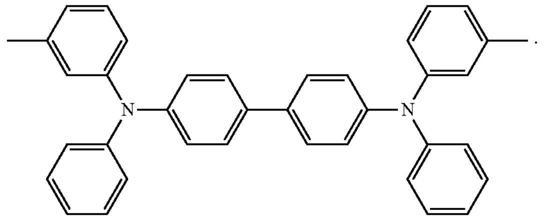

In some embodiments, the N-type organic material layer 1032 may be made of a material that includes: at least one of m-MTDATA and TmPyTZ.

The material for the N-type organic material layer 1032 may be at least one of m-MTDATA and TmPyTZ, and the specific molecular formulas of the two materials are as follows:

m-MTDATA

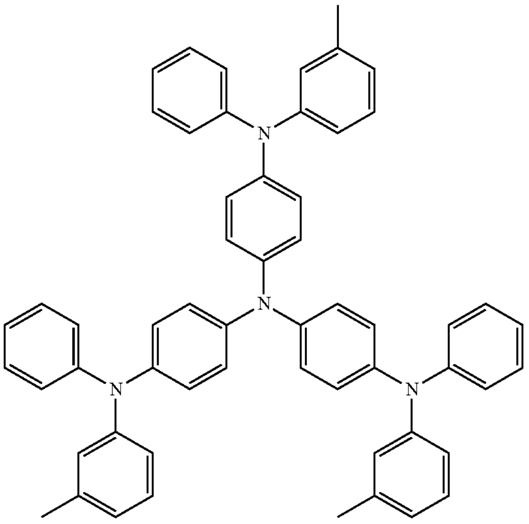

TmPyTZ

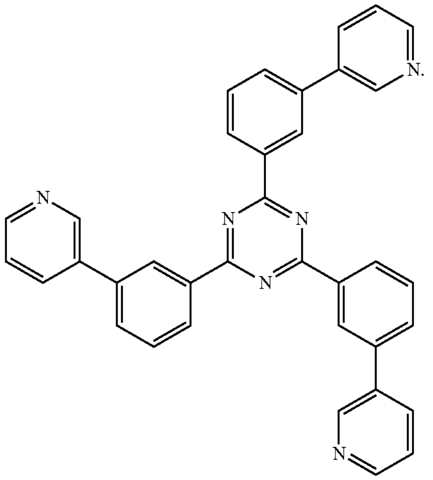

In a second aspect, an embodiment of the present disclosure provides a display device. The display device includes the display substrate according to any one of the above embodiments, and the display device may specifically be: a touch display panel, a mobile phone, a tablet computer, a television, a display, a notebook computer, a digital photo frame, a navigator and other products or components with display functions, and may have the same implementation principle and beneficial effects as those of the display substrate described above, which are not described herein.

It is to be understood that the above embodiments are merely exemplary embodiments adopted to illustrate the principles of the present disclosure, but the present disclosure is not limited thereto. It will be apparent to one of ordinary skill in the art that various modifications and improvements can be made without departing from the spirit and scope of the present disclosure, and such modifications and improvements are also considered to be within the scope of the present disclosure.

What is claimed is:

1. A display substrate, comprising: a substrate, a plurality of light-emitting devices on the substrate, and an optical sensor between at least a portion of adjacent ones of the plurality of light-emitting devices, wherein the optical sensor comprises: a P-type organic material layer and a N-type organic material layer stacked with each other, and a difference between an energy level of a highest occupied molecular orbital of the P-type organic material layer and an energy level of a lowest unoccupied molecular orbital of the N-type organic material layer is less than 2.0 eV or greater than 2.7 eV, wherein each light-emitting device comprises: a light-emitting layer, a hole transport layer on a side of the light-emitting layer close to the substrate, and an electron transport layer on a side of the light-emitting layer away from the substrate, and wherein the P-type organic material layer and the N-type organic material layer are arranged such that:

the P-type organic material layer is in a same layer as the hole transport layer, or the N-type organic material layer is in a same layer as the electron transport layer.

2. The display substrate of claim 1, wherein the display substrate further comprises: a pixel defining layer on the substrate; and the light-emitting devices and the optical sensor are in different regions defined by the pixel defining layer; and the pixel defining layer is made of a light shielding material.

3. The display substrate of claim 1, wherein the P-type organic material layer is made of a material that comprises: at least one of TAPC, NPB and TPD.

4. The display substrate of claim 1, wherein the N-type organic material layer is made of a material that comprises: at least one of m-MTDATA and TmPyTZ.

5. A display device, comprising the display substrate of claim 1.

6. The display substrate of claim 1, wherein the light-emitting layer comprises: a first light-emitting layer and a second light-emitting layer stacked with each other; and each light-emitting device further comprises: a hole generation layer between the first light-emitting layer and the second light-emitting layer and close to the first light-emitting layer, and an electron generation layer between the first light-emitting layer and the second light-emitting layer and close to the second light-emitting layer; and wherein the P-type organic material layer is in a same layer as the hole transport layer, and the N-type organic material layer is in a same layer as the electron generation layer.

7. The display substrate of claim 6, wherein each light-emitting device further comprises: a first auxiliary light-emitting layer between the first light-emitting layer and the hole transport layer, and a second auxiliary light-emitting layer between the second light-emitting layer and the electron generation layer, and wherein the P-type organic material layer is in a same layer as the second auxiliary light-emitting layer, and the N-type organic material layer is in a same layer as the electron transport layer.

8. The display substrate of claim 1, wherein the light-emitting layer comprises: a first light-emitting layer and a second light-emitting layer stacked with each other; and each light-emitting device further comprises: a hole generation layer between the first light-emitting layer and the second light-emitting layer and close to the first light-emitting layer, and an electron generation layer between the first light-emitting layer and the second light-emitting layer and close to the second light-emitting layer; and wherein P-type organic material layer is in a same layer as the hole generation layer, and the N-type organic material layer is in a same layer as the electron transport layer.

9. A display substrate, comprising: a substrate, a plurality of light-emitting devices on the substrate, and an optical sensor between at least a portion of adjacent ones of the plurality of light-emitting devices, wherein the optical sensor comprises: a P-type organic material layer and a N-type organic material layer stacked with each other, and a difference between an energy level of a highest occupied molecular orbital of the P-type organic material layer and an energy level of a lowest unoccupied molecular orbital of the N-type organic material layer is less than 2.0 eV or greater than 2.7 eV, wherein each light-emitting device comprises: a light-emitting layer, a hole transport layer on a side of the light-emitting layer close to the substrate, and an electron transport layer on a side of the light-emitting layer away from the substrate, wherein the light-emitting layer comprises: a first light-emitting layer and a second light-emitting layer stacked with each other; and each light-emitting device further comprises: a hole generation layer between the first light-emitting layer and the second light-emitting layer and close to the first light-emitting layer, and an electron generation layer between the first light-emitting layer and the second light-emitting layer and close to the second light-emitting layer; and each light-emitting device further comprises: a first auxiliary light-emitting layer between the first light-emitting layer and the hole transport layer, and a second auxiliary light-emitting layer between the second light-emitting layer and the electron generation layer, wherein the N-type organic material layer is in a same layer as the electron generation layer.

10. The display substrate of claim 9, wherein the P-type organic material layer is in a same layer as the first auxiliary light-emitting layer.

11. The display substrate of claim 9, wherein the P-type organic material layer is in a same layer as the hole generation layer.

12. A display substrate, comprising: a substrate, a plurality of light-emitting devices on the substrate, and an optical sensor between at least a portion of adjacent ones of the plurality of light-emitting devices, wherein the optical sensor comprises: a P-type organic material layer and a N-type organic material layer stacked with each other, and a difference between an energy level of a highest occupied molecular orbital of the P-type organic material layer and an energy level of a lowest unoccupied molecular orbital of the N-type organic material layer is less than 2.0 eV or greater than 2.7 eV, wherein each light-emitting device comprises: a light-emitting layer, a hole transport layer on a side of the light-emitting layer close to the substrate, and an electron transport layer on a side of the light-emitting layer away from the substrate, wherein the light-emitting layer comprises: a first light-emitting layer and a second light-emitting layer stacked with each other; and each light-emitting device further comprises: a hole generation layer between the first light-emitting layer and the second light-emitting layer and close to the first light-emitting layer, and an electron generation layer between the first light-emitting layer and the second light-emitting layer and close to the second light-emitting layer; and each light-emitting device further comprises: a first auxiliary light-emitting layer between the first light-emitting layer and the hole transport layer, and a second auxiliary light-emitting layer between the second light-emitting layer and the electron generation layer, wherein the P-type organic material layer comprises: a first P-type organic material layer and a second P-type material layer;

the N-type organic material layer comprises: a first N-type organic material layer and a second N-type organic material layer;

the first P-type organic material layer is in a same layer as the first auxiliary light-emitting layer;

the first N-type organic material layer is in a same layer as the electron generation layer;

the second P-type organic material layer is in a same layer as the second auxiliary light-emitting layer; and the second N-type organic material layer is in a same layer as the electron transport layer.

* * * * *